United States Patent
McCullen et al.

(10) Patent No.: US 8,627,247 B1
(45) Date of Patent: Jan. 7, 2014

(54) SYSTEMS AND METHODS FOR FIXING PIN MISMATCH IN LAYOUT MIGRATION

(75) Inventors: Kevin W. McCullen, EssexJunction, VT (US); Matthew T. Guzowski, Essex Junction, VT (US); Rani Narayan, San Jose, CA (US); Xiaoping Tang, Mohegan Lake, NY (US); Xin Yuan, Roseville, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/546,562

(22) Filed: Jul. 11, 2012

(51) Int. Cl.
   *G06F 17/50* (2006.01)

(52) U.S. Cl.
   USPC ............................ 716/103; 716/132; 716/123

(58) Field of Classification Search
   None
   See application file for complete search history.

(56) References Cited

U.S. PATENT DOCUMENTS

| | | | |
|---|---|---|---|
| 6,189,132 B1 | 2/2001 | Heng et al. | |
| 6,360,352 B2 * | 3/2002 | Wallace | 716/103 |
| 6,473,885 B1 * | 10/2002 | Wallace | 716/107 |
| 6,756,242 B1 * | 6/2004 | Regan | 438/14 |
| 6,986,109 B2 | 1/2006 | Allen et al. | |
| 7,039,881 B2 * | 5/2006 | Regan | 716/103 |
| 7,568,173 B2 | 7/2009 | Gernhoefer et al. | |
| 7,774,735 B1 | 8/2010 | Sood | |
| 7,882,463 B2 * | 2/2011 | Heng et al. | 716/103 |
| 2003/0084418 A1 | 5/2003 | Regan | |
| 2005/0091627 A1 | 4/2005 | Satapathy et al. | |
| 2008/0092089 A1 * | 4/2008 | Kobayashi | 716/1 |
| 2008/0134109 A1 | 6/2008 | Hammouda et al. | |
| 2008/0222578 A1 | 9/2008 | Joshi | |
| 2011/0161907 A1 * | 6/2011 | Cheng et al. | 716/119 |

FOREIGN PATENT DOCUMENTS

| | | | |
|---|---|---|---|
| WO | 2009007311 A1 | 1/2009 | |
| WO | 2011072038 A2 | 6/2011 | |

OTHER PUBLICATIONS

Dessouky, M., "Analog Design Migration:Aan Overview", IEEE, 2009, pp. 992-995.

* cited by examiner

*Primary Examiner* — Leigh Garbowski
(74) *Attorney, Agent, or Firm* — Richard Kotulak; Roberts Mlotowski Safran & Cole, P.C.

(57) ABSTRACT

Approaches are provided for fixing pin mismatches from swapping library cells in layout migration. Specifically, a method is provided that includes collecting information about a first technology pin from a library cell in a first technology. The method further includes swapping the library cell in the first technology with a library cell in a second technology. The method further includes collecting information about a second technology pin from the library cell in the second technology. The method further includes building a pin-mapping table that is configured to map the first technology pin to the second technology pin. The method further includes scaling a layout from the first technology to the second technology. The method further includes modifying the layout based on the pin-mapping table to match the at least one first technology pin to the at least one second technology pin while satisfying ground rules of the second technology.

20 Claims, 9 Drawing Sheets

First Layout 705

Second Layout 715

Sorted Pin-List 1: (608,4449 ◆ 1160,4521)

Sorted Pin-List 2: (420,3880 ◆ 480,3970)
(420,3820 ◆ 880,3880)
(420,3970 ◆ 880,4030)

1 pair Shift Δ720 (between 700 and 730) = (3970+3880)/2 − (4521+4449)/2 * 10/13 = 3925 − 4485 * 10/13 = 475

Overall Shift Δ725 = 300

Adjust: (608,4449 ◆ 1160,4521) * 10/13 + 300 = (468,3897 ◆ 892,3952)

Cost of Mapping to (420,3880 ◆ 480,3970) 730 = max (|420−468|,|480−892|) + (|3880−3897|+|3970−3952|) = 447

Cost of Mapping to (420,3820 ◆ 880,3880) 735 = max (|420−468|,|880−892|) + max (|3820−3897|+|3880−3952|) = 125

Cost of Mapping to (420,3970 ◆ −880,4030) 740 = max (|420−468|,|880−892|) + max (|3970−3897|+|4030−3952|) = 126

SYSTEMS AND METHODS FOR FIXING PIN MISMATCH IN LAYOUT MIGRATION

FIELD OF THE INVENTION

The invention relates to circuit design and, more particularly, to systems and methods for fixing pin mismatches from swapping library cells in layout migration.

BACKGROUND

Semiconductor chip layout is subject to complex rules governing, among other things, geometry of shapes on process layers. These complex rules may include, for example, width requirements, spacing requirements, overlap requirements, etc. Compliance with these design rules is important to chip functionality and manufacturability.

Many processes used to create or alter layouts can introduce design rule violations. Manual layout, for example, inevitably introduces violations due to the difficulty of satisfying a large number of complex design rules by hand. These violations are generally corrected via tedious iterations between design rule checking tool runs and manual layout modifications.

Technology migration is another process which gives rise to a large number of design rule violations. Migration is the process, which transforms layouts in one technology to a layout in another technology with different design rules. The migration process begins with scaling, using commercially available programs, and is sufficient to produce a design-rule-correct layout. However, in many cases, non-scalable differences in the design rules result in the introduction of design rules violations, which must again be corrected by tedious manual iteration.

For example, due to the technology difference in technology migration, many library cells grow bigger in terms of pitch. This difference in pitch may potentially create pin mismatches in the new integrated circuit layout. The pin mismatches, if not corrected, may cause the wiring of the integrated circuit to be misaligned.

Conventional layout migration methodology can perform the placement of grown library cells, but does not address the issue of pin mismatches. Specifically, pin mismatches pose a severe challenge in technology migration, which causes difficulty in reusing the wiring connections during layout migration.

Accordingly, there exists a need in the art to overcome the deficiencies and limitations described hereinabove.

BRIEF SUMMARY

In a first aspect of the invention, a method is provided that includes collecting information about at least one first technology pin from at least one library cell in a first technology. The method further includes swapping the at least one library cell in the first technology with at least one library cell in a second technology. The method further includes collecting information about at least one second technology pin from the at least one library cell in the second technology. The method further includes building a pin-mapping table that is configured to map the at least one first technology pin to the at least one second technology pin. The method further includes scaling a layout from the first technology to the second technology. The method further includes modifying the layout based on the pin-mapping table to match the at least one first technology pin to the at least one second technology pin while satisfying the ground rules of the second technology.

In another aspect of the invention, a method implemented in an infrastructure is provided that includes collecting information about first technology pins from a first technology. The method further includes collecting information about second technology pins from a second technology. The method further includes building a pin-mapping table that is configured to map at least one first technology pin to at least one second technology pin, wherein the pin-mapping table is built based on a mapping cost between a first rectangle representative of the at least one first technology pin and a second rectangle representative of the at least one second technology pin. The method further includes scaling a layout from the first technology to the second technology. The method further includes modifying the layout based on the pin-mapping table to match the at least one first technology pin to the at least one second technology pin while satisfying the ground rules of the second technology.

In yet another aspect of the invention, a computer system is provided that includes a CPU, a computer readable memory and a computer readable storage media. The system further includes first program instructions to pair each rectangle representative of a pin from a first technology to at least one rectangle representative of at least one pin from a second technology. The system further includes second program instructions to calculate a shift in a "y" direction for each of the pairs of rectangles. The system further includes third program instructions to compare the calculated shifts in the "y" direction for each pair of rectangles. The system further includes fourth program instructions to select a calculated shift with a minimum absolute value as an overall shift in the "y" direction from the compared pairs of rectangles. The system further includes fifth program instructions to adjusting coordinates of each rectangle from the first technology based on the selected overall shift in the "y" direction. The system further includes sixth program instructions to calculate a mapping cost for each rectangle from the first technology to each rectangle of the second technology using the adjusted coordinates of each rectangle from the first technology. The system further includes seventh program instructions to map each rectangle from the first technology to a rectangle from the second technology such that the mapped rectangles comprise a lowest calculated mapping cost. The first through seventh program instructions are stored on the computer readable storage media for execution by the CPU via the computer readable memory.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to circuit design and, more particularly, to systems and methods for fixing pin mismatches from swapping library cells in layout migration. More specifically, implementations of the invention provide a system and method to collect pin information for library cells in a first technology, collect pin information for library cells in a second technology, build a pin-mapping table from the collected pin information between the first technology and the second technology, scale the integrated circuit layout with respect to the second technology, and modify the pins in the second technology based on the pin-mapping table.

In embodiments, geometric relationships are defined on the layout of the integrated circuit utilizing the first technology. The defined geometric relationships accurately capture the wire connections with respect to the pins of the library cells for the first technology. Subsequently, the pins of the library cells are modified to match pin shapes and locations within the layout of the integrated circuit utilizing the second technology. During the layout migration geometric constraints and linear program (LP) solving may modify the interconnect wires to connect the pins with respect to the library cell of the second technology. Advantageously, the systems and methods of the present invention use the original topography of the first technology to reconnect the pins in the second technology.

Figure 1:
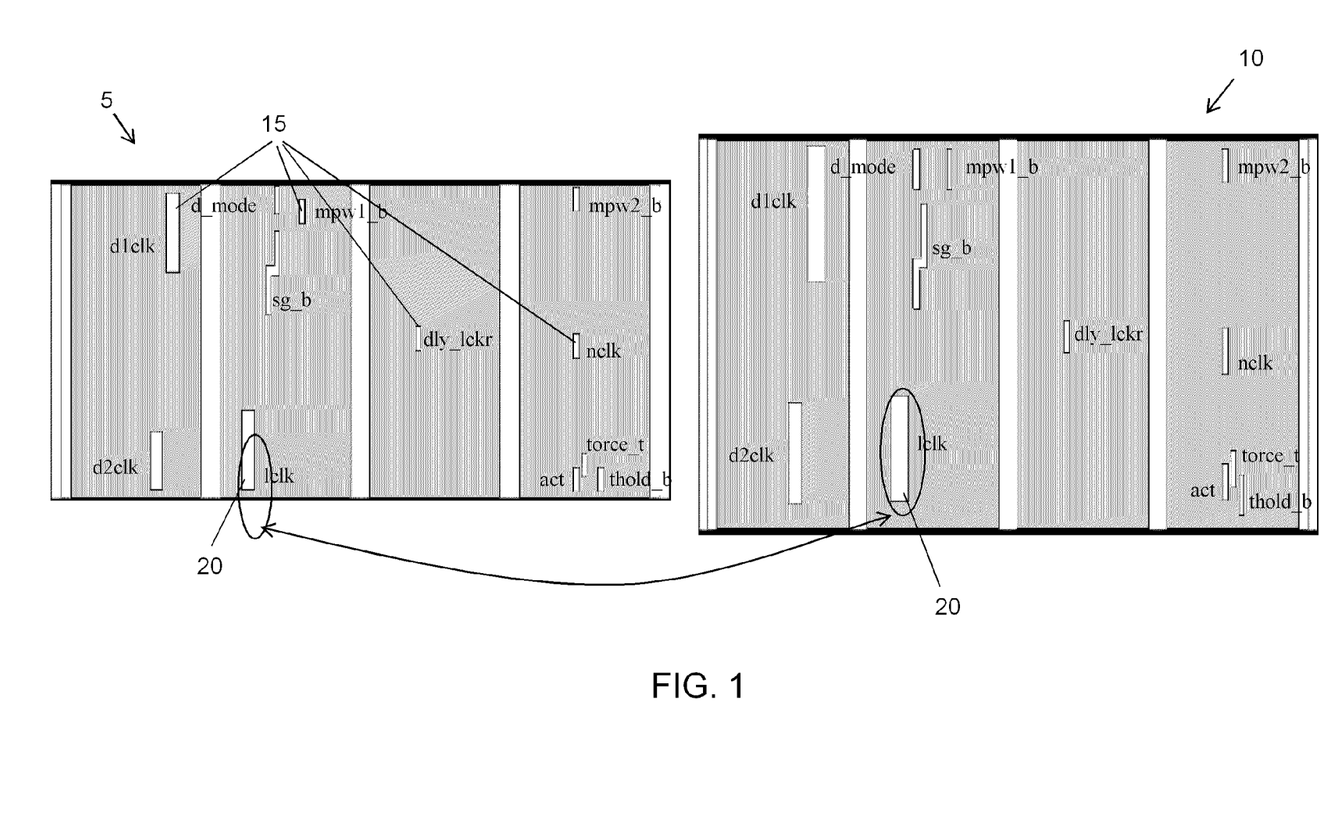
FIGS. 1-3 show examples of pin mismatches that may occur during technology migration.
Figure 2:
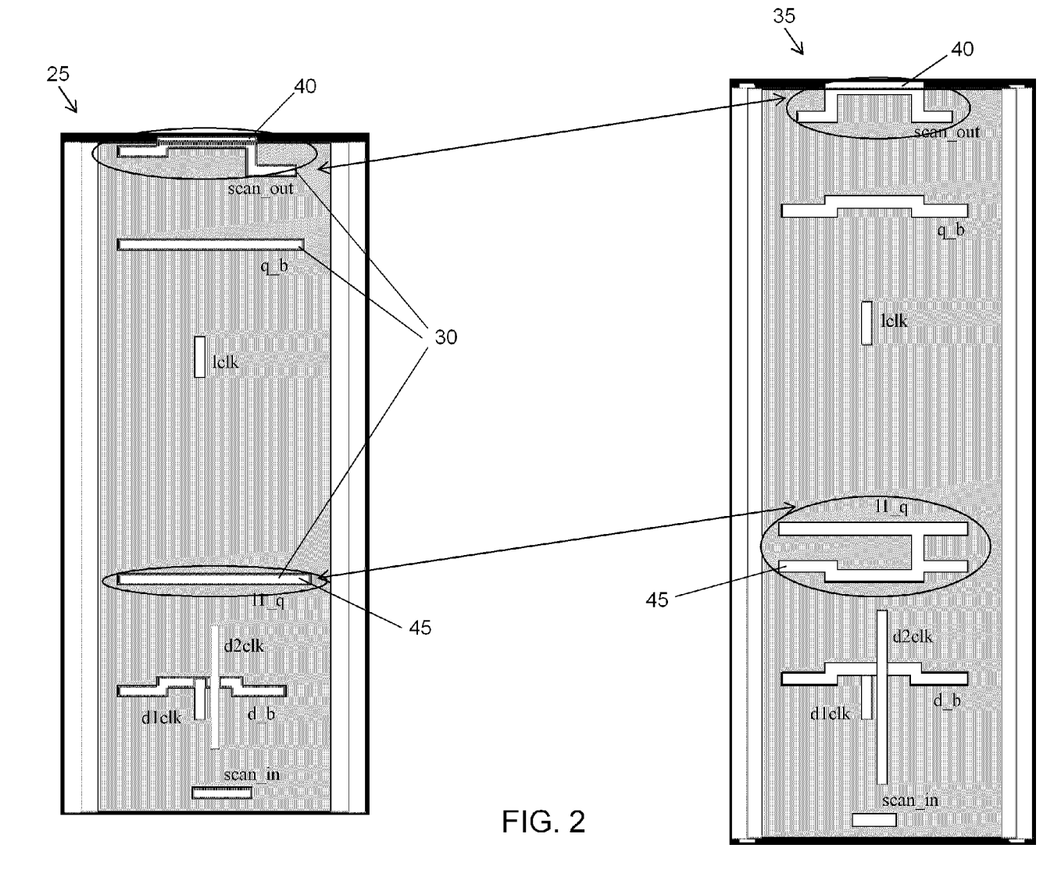
Figure 3:
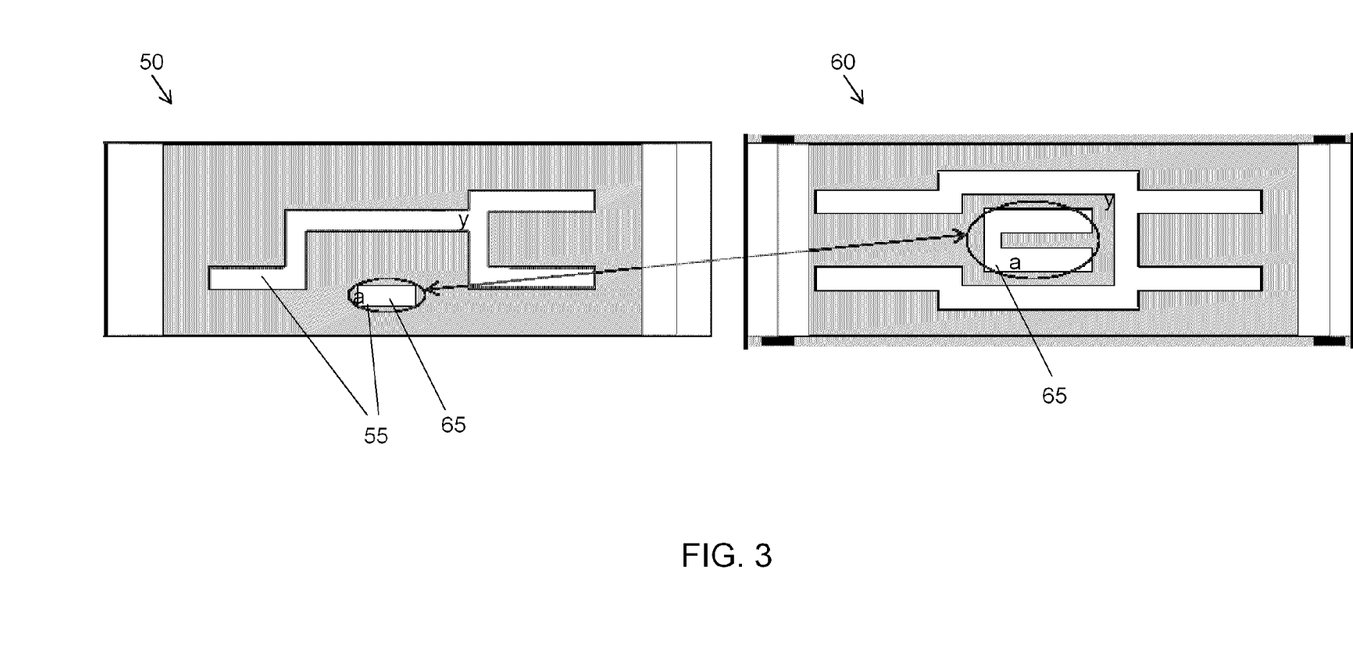

FIGS. 1-3 show multiple examples of pin mismatches that may occur between library cells of a first technology and library cells of a second technology. The pin mismatches may be caused by location, dimension, and/or topography changes introduced to the pins during the scaling and/or layout migration from the first technology to the second technology. For example, FIG. 1 shows a library cell 5, e.g., a local clock buffer, designed using a first technology, e.g., 32 nm technology. The library cell 5 comprises multiple pins 15 for connecting the devices of the library cell 5 to interconnect wiring and or other devices of an integrated circuit. FIG. 1 also shows a corresponding library cell 10 designed using the second technology, e.g., 22 nm technology. As can be seen between library cells 5 and 10, the pin 20 has changed location and dimension due to the scaling and/or layout migration of the library cell between the first technology and the second technology. This change in the location and the dimension of pin 20 between the first technology and the second technology may cause a misalignment of interconnect wiring if the changes in the location and the dimension of pin 20 are not accounted for during the layout design phase for the second technology.

FIG. 2 shows a library cell 25, e.g., a local clock buffer, designed using a first technology, e.g., 32 nm technology. The library cell 25 comprises multiple pins 30 for connecting the devices of the library cell 25 to interconnect wiring and/or devices of the integrated circuit. FIG. 2 also shows a corresponding library cell 35 designed using the second technology, e.g., 22 nm. As can be seen between library cells 25 and 35, the pin 40 has changed location and the pin 45 has changed location and topology due to the scaling and/or layout migration of the library cell between the first technology and the second technology. These changes in the location of pin 40 and the location and the topology of pin 45 between the first technology and the second technology may cause a misalignment of interconnect wiring if the changes are not accounted for during the layout design phase for the second technology.

FIG. 3 shows a library cell 50, e.g., a logic cell, designed using a first technology, e.g., 32 nm technology. The library cell 50 comprises multiple pins 55 for connecting the devices of the library cell 50 to interconnect wiring and/or devices of the integrated circuit. FIG. 3 also shows a corresponding library cell 60 designed using the second technology, e.g., 22 nm. As can be seen between library cells 50 and 60, the pin 65 has changed location and topology due to the scaling and/or layout migration of the library cell between the first technology and the second technology. These changes in the location and the topology of pin 65 between the first technology and the second technology may cause a misalignment of interconnect wiring if the changes in the location and the topology of pin 65 are not accounted for during the layout design phase for the second technology.

Implementations of the present invention can fix the pin mismatches shown in FIGS. 1-3. As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program instructions may also be stored in the computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
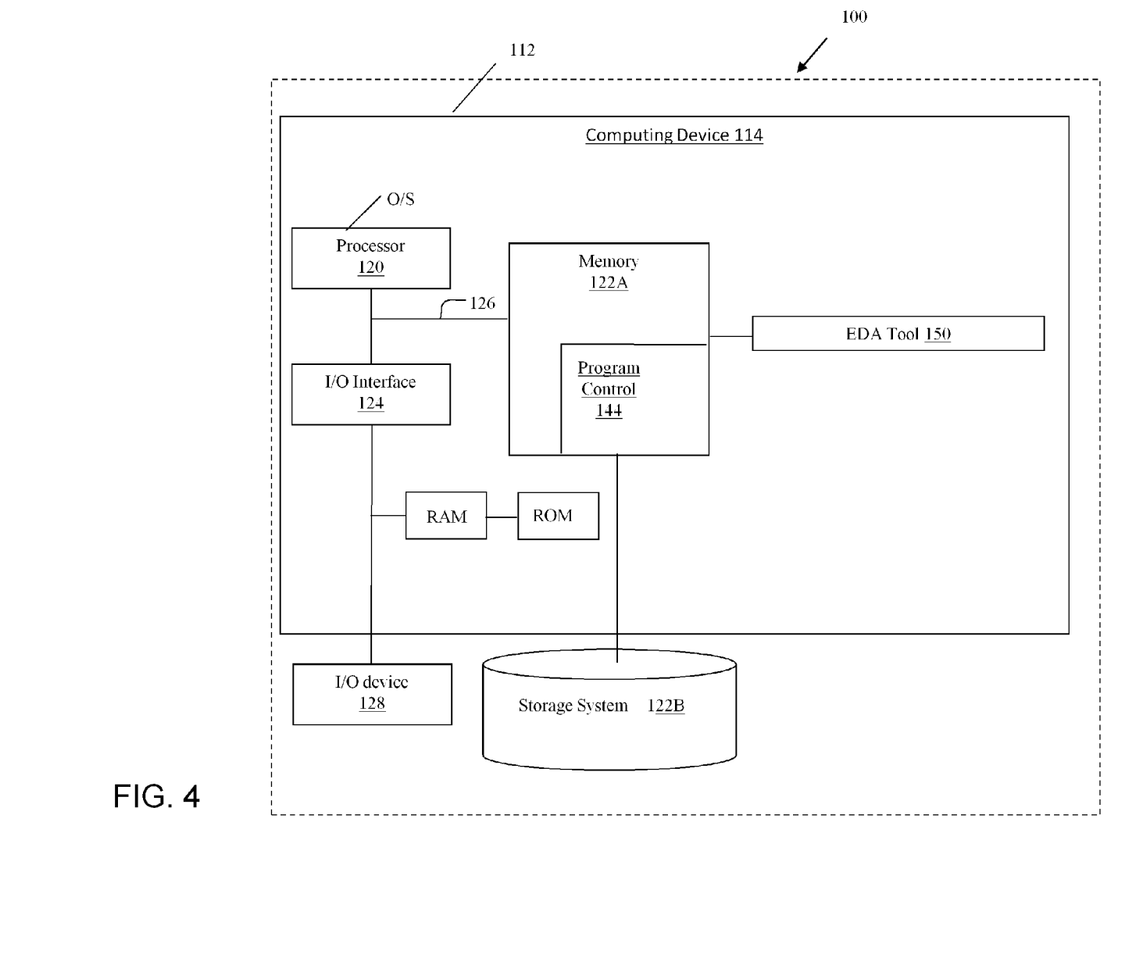
FIG. 4 is an illustrative external environment for implementing the invention in accordance with aspects of the invention.

FIG. 4 shows an illustrative environment 100 for managing the processes in accordance with the invention. To this extent, the environment 100 includes a server or other computing system 112 that can perform the processes described herein. In particular, the server 112 includes a computing device 114. The computing device 114 can be resident on a network infrastructure or computing device of a third party service provider (any of which is generally represented in FIG. 4).

The computing device 114 also includes a processor 120, memory 122A, an I/O interface 124, and a bus 126. The memory 122A can include local memory employed during actual execution of program code, bulk storage, and cache memories, which provide temporary storage of at least some program code, in order to reduce the number of times code should be retrieved from bulk storage during execution. In addition, the computing device includes random access memory (RAM), a read-only memory (ROM), and an operating system (O/S).

The computing device 114 is in communication with the external I/O device/resource 128 and the storage system 122B. For example, the I/O device 128 can comprise any device that enables an individual to interact with the computing device 114 (e.g., user interface) or any device that enables the computing device 114 to communicate with one or more other computing devices using any type of communications link. The external I/O device/resource 128 may be for example, a handheld device, PDA, handset, keyboard, etc.

In general, the processor 120 executes computer program code (e.g., program control 144), which can be stored in the memory 122A and/or storage system 122B. Moreover, in accordance with aspects of the invention, the program control 144 controls an electronic design automation (EDA) tool 150 to perform the processes described herein. The EDA tool 150 can be implemented as one or more program code in the program control 144 stored in memory 122A as separate or combined modules. Additionally, the EDA tool 150 may be implemented as a separate dedicated processor or several processors to provide the function of this tool. While executing the computer program code, the processor 120 can read and/or write data to/from memory 122A, storage system 122B, and/or I/O interface 124. The program code executes the processes of the invention. The bus 126 provides a communications link between each of the components in the computing device 114.

In embodiments, the EDA tool 150 can fix pin mismatches caused from swapping library cells during a layout migration. For example, in accordance with aspects of the invention, the EDA tool 150 can collect pin information for library cells in a first technology, collect pin information for library cells in a second technology, build a pin-mapping table from the collected pin information between the first technology and the second technology, scale the integrated circuit layout with respect to the second technology, and modify the pins in the second technology based on the pin-mapping table.

Figure 5:
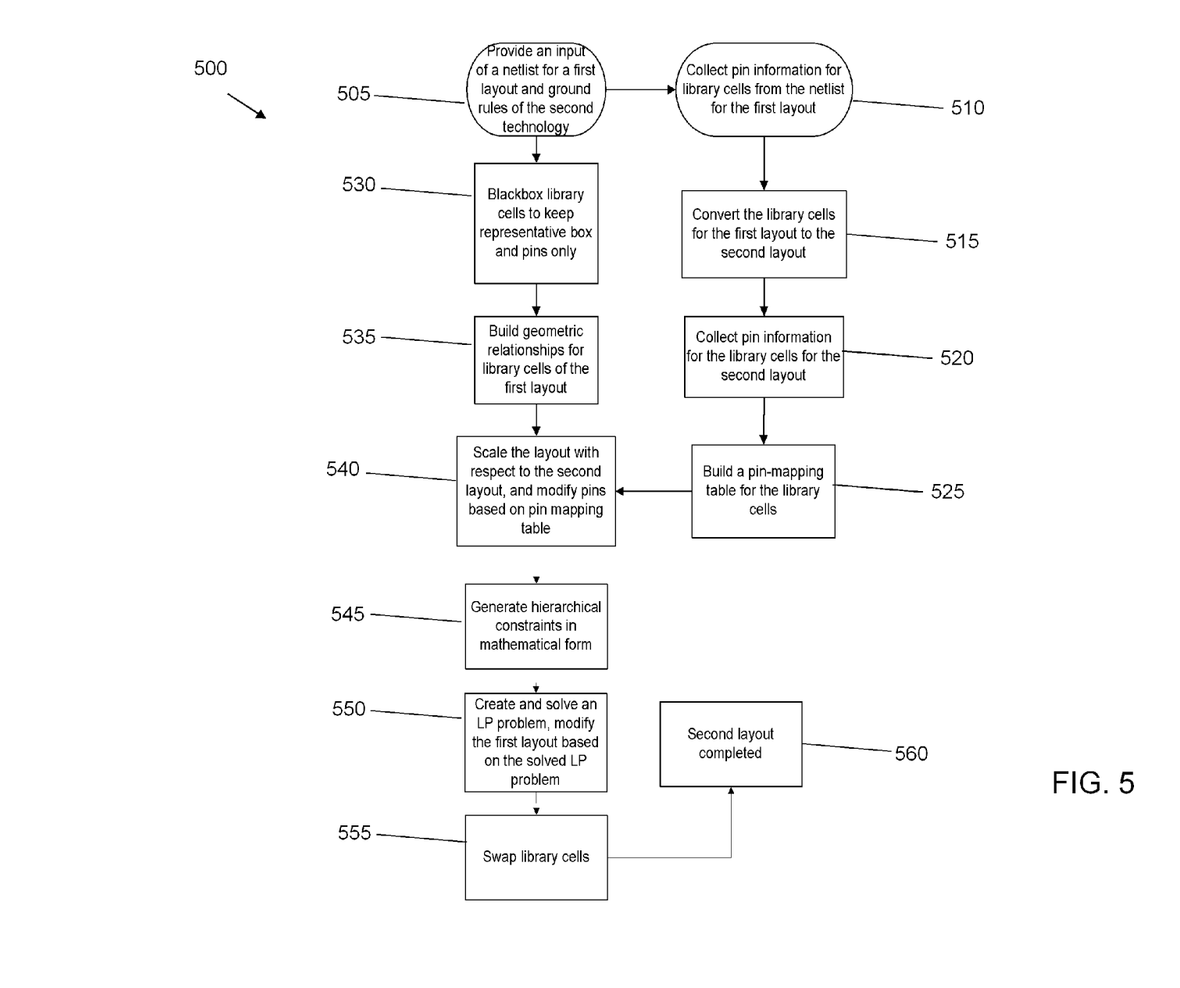
FIGS. 5 and 6 are flow diagrams of processes in accordance with aspects of the invention.
Figure 6:
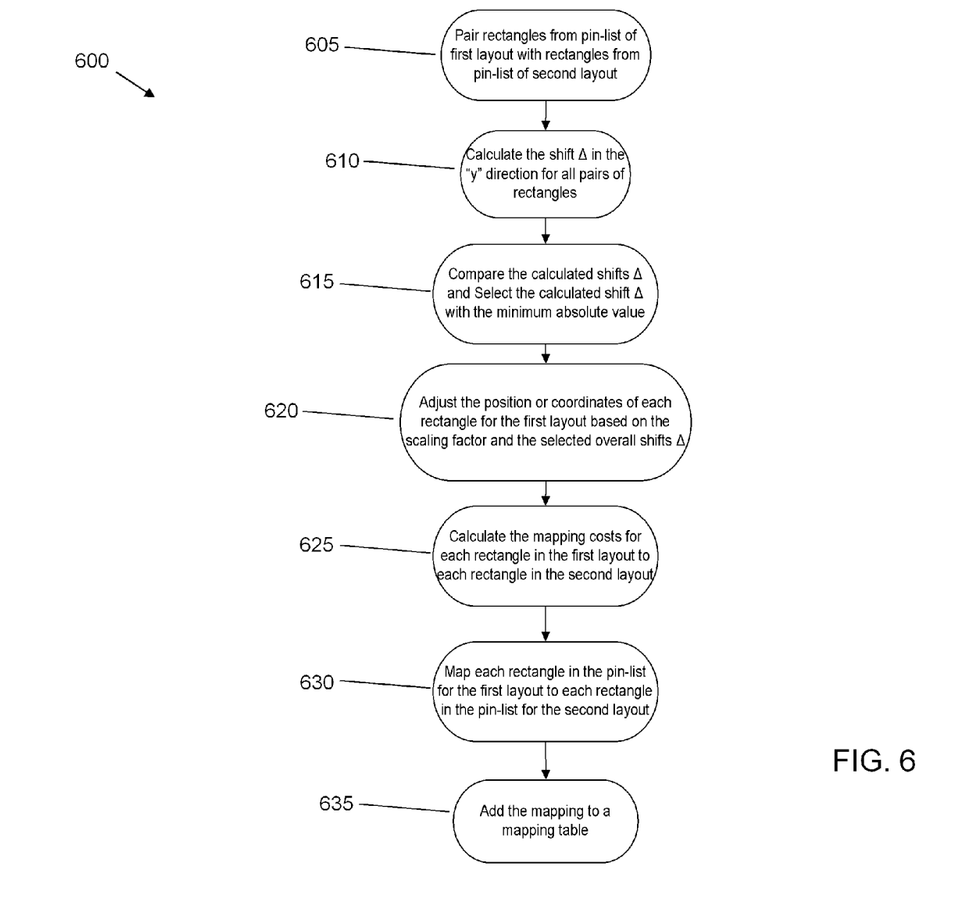

FIGS. 5 and 6 show exemplary flows for performing aspects of the present invention. The steps of FIGS. 5 and 6 may be implemented to solve the problem of pin mismatches between different technologies during layout migration. The flowcharts and block diagrams in FIGS. 5 and 6 illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

FIG. 5 depicts an exemplary flow 500 for a layout migration of library cells from a first technology to a second technology. At step 505, an input comprising a netlist or other formatted listing of components and/or circuits and their positions in a first layout (e.g., a first technology layout or an old layout) and ground rules of the second technology is provided. At step 510, pin information for library cells in the netlist of the first layout are collected. In embodiments, the pin information includes the name of each pin and the rectangle in a given pin layer that represents each pin. The rectangles are then sorted in a pin-list. In embodiments, the rectangles for each of the pins may be sorted in the pin-list based on a center point of each rectangle, and the sorting criteria can be either from left to right (i.e., non-descending order of the "x" coordinate of the center points), or from bottom to top (i.e., non-descending order of the "y" coordinate of the center points), or the non-descending order of the summation of "x" and "y" coordinates of the center points.

At step 515, the library cells of the first layout are converted in an initial pass to a second layout (e.g., a second technology layout or a new layout). In embodiments, this is performed by swapping of library cells of the second technology to convert the library cells of the first layout to the second layout. At step 520, pin information for library cells in the second layout is collected. In embodiments, the pin information includes the name of each pin, e.g., two matching pins between the library cell in the first layout and its swapped cell in the second layout may have a same name, and the rectangles in a given pin layer that represent each pin. The rectangles are then sorted in a pin-list, as described above with respect to the first layout.

At step 525, a pin-mapping table is built to map the pins in library cells of the first layout to pins in library cells of the second layout. In embodiments, the number of rectangles for each pin may be different between the library cells of first technology and the library cells of the second technology because of shifts in topology between corresponding library cells. For example, the number of rectangles for each library cell of the first technology may increase, decrease, or remain equal as compared to each corresponding library cell of the second technology.

In embodiments, the rectangles in the first layout are mapped to the rectangles in the second layout based on a mapping cost, e.g., a minimum mapping cost, while taking into consideration an overall shift Δ in the "y" direction with respect to the gates of each library cell, as discussed in further detail below with respect to FIG. 6. The overall shift Δ in the "y" direction may be caused by library cell growth during the scaling process in step 515. Advantageously, using the mapping cost and the overall shift Δ in the "y" direction provides an efficient and effective approach to mapping the pins between the two layouts.

At step 530, all the shapes are deleted except for the pins and representative boundary box of the library cell such that only the pins and the representative boundary box are visible in subsequent steps. At step 535, geometric relationships are built for the first layout. In embodiments, a geometry database may be built that provides geometrical relationship information regarding elements (e.g., tiles or rectangles) of the first layout. For example, an integrated circuit is generally composed of multiple layers, and each layer typically includes a collection of shapes (e.g., tiles or rectangles). The shapes may be wires on a routing layer or may be active regions in a diffusion area. On a given layer, two shapes generally overlap one another only if those two shapes are electrically connected. The function of the geometric database is to create an appropriate data structure for each collection of shapes. Advantageously the geometric database allows the wire connections to be captured correctly with respect to the pins of the library cells in the first layout.

At step 540, all components in the first layout are scaled with respect to the second layout using a predetermined scaling factor. Now the pin-mapping table generated in step 525 is used to modify the pins from the first layout to match the pin shapes and locations in the second layout.

At step 545, hierarchical constraints are generated in mathematical form. In embodiments, the first layout and the ground rule files of the second technology are used to define hierarchical constraints of the first layout in mathematical form. Typical ground rules may include spacing rules specifying minimum space between objects, width rules specifying minimum width of some objects, and methodology rules specifying design requirements for assembling library cells. The ground rules ensure manufacturability of the integrated circuit.

At step 550, an LP problem is generated and solved, and the first layout is modified based on the LP problem. Generating and solving LP problems is a mathematical method for determining a way to achieve a best outcome (e.g., an integrated circuit running with a specified speed or delay) in a given mathematical model for some list of requirements represented as linear relationships. In embodiments, generating the LP problem may comprise building the hierarchical constraints in the form of an initial inequality expression and then deriving the LP problem from the inequality expression by relaxing integer constraints and using relaxation variables on infeasible constraints. As used herein, relaxing integer constraints means that certain constraints are not applied and infeasible constraints means constraints that are not satisfied for the given layout.

The LP problem is then solved to obtain an LP solution. For example, the LP problem may be solved by using traditional LP solvers, e.g., interior-point methods or simplex algorithms. Once the LP problem is solved, then a modified first layout is outputted. The modified first layout meets the ground rules and is optimal in terms of predetermined objectives for the second layout.

At step 555, the library cells of the first layout are replaced with the corresponding library cells of the second technology. In embodiments, each library cell in the first layout is swapped with a new library cell from the second technology. The library cells of the first layout are removed from the layout and the new library cells are placed in the layout to generate the second layout. The new library cells are placed in the layout with same coordinates, orientation, and magnification. Once the new library cells are in position in the layout, the pins are automatically connected to the external wires, as the hierarchical constraints and the LP problem solving in step 550 are configured to modify the wires to connect to the new locations of the modified pins with respect to the library cells in the new layout. Therefore, the library cell swapping is no longer disruptive to reconnecting the wires to the pins. The swapping of the library cells results in achievement of the second layout for the integrated circuit at step 560.

FIG. 6 depicts an exemplary flow 600 for building a pin-mapping table that takes into consideration a minimum mapping cost and an overall shift $\Delta$ in the "y" direction. At step 605, the rectangles from the pin-list generated for the first layout at step 510 (as discussed above with respect to FIG. 5) are paired with the rectangles or a set of rectangles in the pin-list generated for the second layout at step 520 (as discussed above with respect to FIG. 5). In embodiments, the rectangles are compared according to the order in which the rectangles are sorted within each pin-list, e.g., based on a center point of each rectangle or set of rectangles. At step 610, the shift $\Delta$ in the "y" direction for all pairs of rectangles is computed or calculated. The shift $\Delta$ in the "y" direction may be caused by library cell growth during the scaling process in step 515 (as discussed above with respect to FIG. 5). In embodiments, the shift $\Delta$ in the "y" direction for each pair of rectangles may be calculated using equation (1) with respect to the gate(s) of each library cell.

$$\Delta \text{ in } y = (\text{center } Y \text{ location of } n_1 \text{ rectangle of pin-list for second layout}) - (\text{center } Y \text{ location of } n_1 \text{ rectangle of pin-list for first layout})*\text{the scaling factor} \quad (1)$$

At step 615, the calculated shifts $\Delta$ in the "y" direction for each pair of rectangles are then compared, and the calculated shift $\Delta$ with the minimum absolute value is selected as the overall shift $\Delta$ in the "y" direction. At step 620, the position or coordinates of the rectangles from the pin-list generated for the first layout are adjusted based on the scaling factor and the selected overall shift $\Delta$ using equation (2).

$$(\text{center } Y \text{ location of } n_1 \text{ rectangle of pin-list for first layout})*\text{the scaling factor} + \text{overall shift } \Delta \text{ in } y \quad (2)$$

At step 625, the mapping costs are computed or calculated for each rectangle in the first layout to each rectangle in the second layout. The mapping cost is defined as the amount of minimum movement (e.g., movement in a two dimensional space) that it would take to place a rectangle from the first layout (in embodiments the position of the rectangle being the adjusted position calculated based on equation (2)) over a new rectangle from the second layout. In embodiments, the mapping cost may be calculated as a cost in the "x" direction plus a cost in the "y" direction. In accordance with aspects of the invention, the two dimensions can be treated as independent of one another.

The rectangle (e.g., a first layout rectangle) may be expressed as (r1: xl1, yl1♦xh1, yh1), where xl1 is the "x" coordinate or position of the left bottom corner of the rectangle, yl1 is the "y" coordinate or position of the left bottom corner of the rectangle, xh1 is the "x" coordinate or position of the top right corner of the rectangle, and yh1 is the "y" coordinate or position of the top right corner of the rectangle. The new rectangle (e.g., a second layout rectangle) may be expressed as (r2: xl2, yl2♦xh2, yh2), where xl2 is the "x" coordinate or position of the left bottom corner of the new rectangle, yl2 is the "y" coordinate or position of the left bottom corner of the new rectangle, xh2 is the "x" coordinate or position of the top right corner of the new rectangle, and yh2 is the "y" coordinate or position of the top right corner of the new rectangle.

In embodiments, the cost in the "x" direction may be calculated using equation (3). Assuming the coordinates or position of the rectangle (e.g., a first layout rectangle) is already adjusted (e.g., adjusted with respect to the scaling factors) based on equation (2).

If $(xl2-xl1)$ and $(xh2-xh1)$ have the same sign (+/−), then

Cost=max(|xl2−xl1|,|xh2−xh1|), else

Cost=|xl2−xl1|+|xh2−xh1| where $|a-b|$ denotes the absolute value of $(a-b)$. \quad (3)

In embodiments, the cost in the "y" direction may be calculated using equation (4). Assuming the coordinates or position of the rectangle (e.g., a first layout rectangle) is already adjusted (e.g., adjusted with respect to the scaling factors) based on equation (2).

If $(yl2-yl1)$ and $(yh2-yh1)$ have the same sign (+/−), then

Cost=max($|yl2-yl1|, |yh2-yh1|$), else

Cost=$|yl2-yl1|+|yh2-yh1|$ where $|a-b|$ denotes the absolute value of $(a-b)$. (4)

In embodiments, the calculated cost in the "x" direction from equation (3) may then be added to the calculated cost in the "y" direction from equation (4) to calculate the mapping cost.

At step 630, each rectangle in the pin-list for the first layout is mapped to each rectangle in the pin-list for the second layout based on calculated mapping costs while taking into consideration the calculated overall shift Δ in the "y" direction. For example, the pair of rectangles with the minimum mapping cost may be mapped together. At step 635, the mappings for each rectangle are added to a mapping table.

Figure 7:
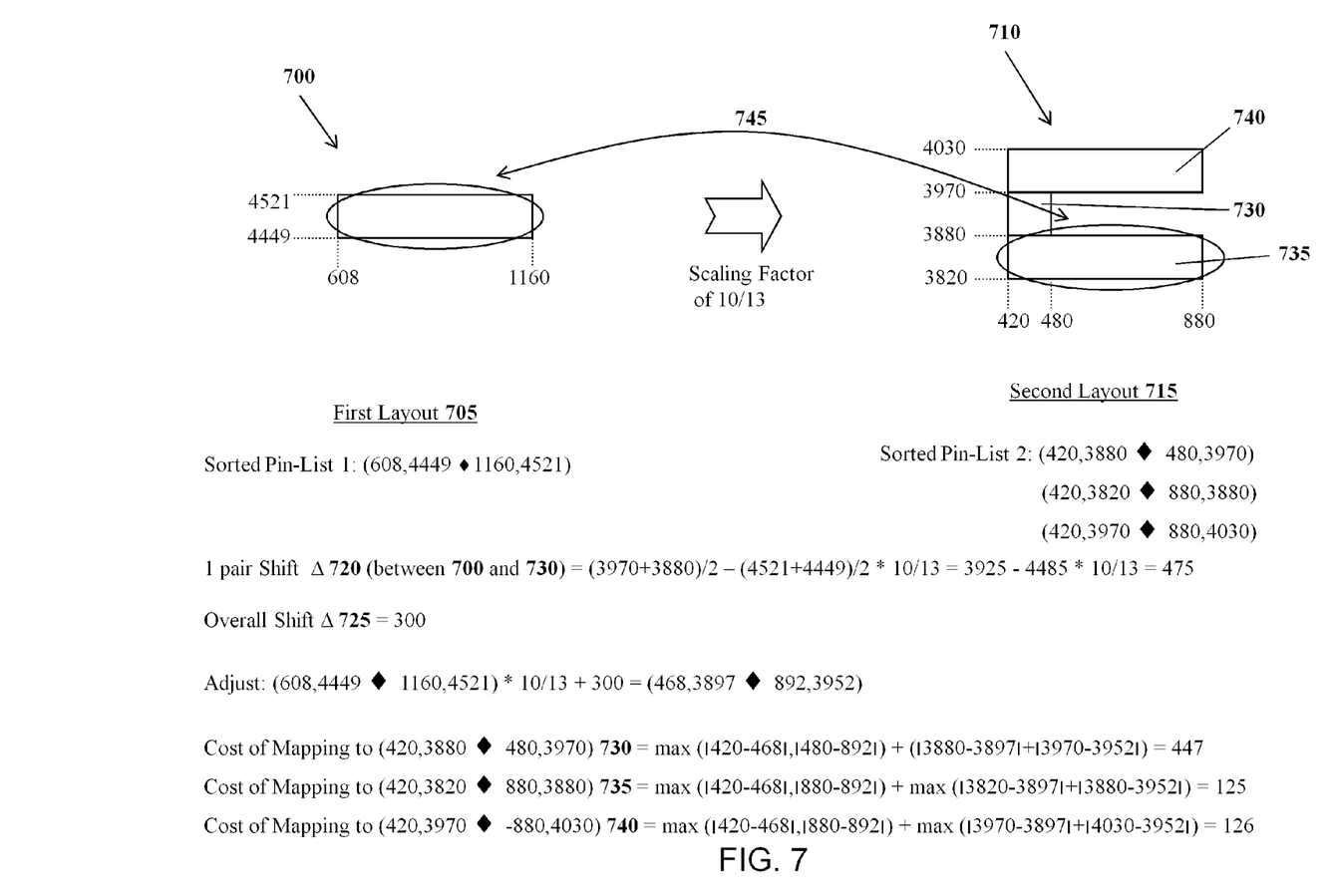
FIGS. 7 and 8 show examples of calculating mapping costs between two different layouts or technologies in accordance with aspects of the invention.

For example, as shown in FIG. 7, the rectangle 700 from the pin-list generated for the first layout 705 is paired with a set of rectangles 710 from the pin-list generated for the second layout 715. The shift Δ 720 in the "y" direction for each pair of rectangles is calculated using equation (1). The calculated shifts Δ in the "y" direction for each pair of rectangles are then compared, and the calculated shift Δ with the minimum absolute value is selected as the overall shift Δ 725 in the "y" direction. The mapping location or coordinates of the rectangle 700 is then adjusted based on the scaling factor and the overall shift Δ 725 using equation (2).

The mapping cost from adjusted location of rectangle 700 to each rectangle in the set of rectangles 710 is then calculated using equations (3) and (4). For example, the mapping cost of moving the rectangle 700 from the adjusted position of (468, 3897♦892,3952) to the position of (420,3880♦480,3970) for the rectangle 730 is calculated as 447, the mapping cost of moving the rectangle 700 from the adjusted position of (468, 3897♦892,3952) to the position of (420,3820♦880,3880) for the rectangle 735 is calculated as 125, and the mapping cost of moving the rectangle 700 from the adjusted position of (468, 3897♦892,3952) to the position of (420,3970♦880,4030) for the rectangle 740 is calculated as 126.

The rectangle 700 is then mapped 745 to the rectangle 735 based on the mapping cost calculated for each pair of rectangles while taking into consideration the calculated overall shift Δ in the "y" direction. For example, the lowest calculated mapping cost may be used to identify the corresponding rectangle 735 in the set of rectangles 710 that corresponds with the rectangle 700. The mapping 745 for rectangles 700 and 735 is then added to the mapping table.

Figure 8:
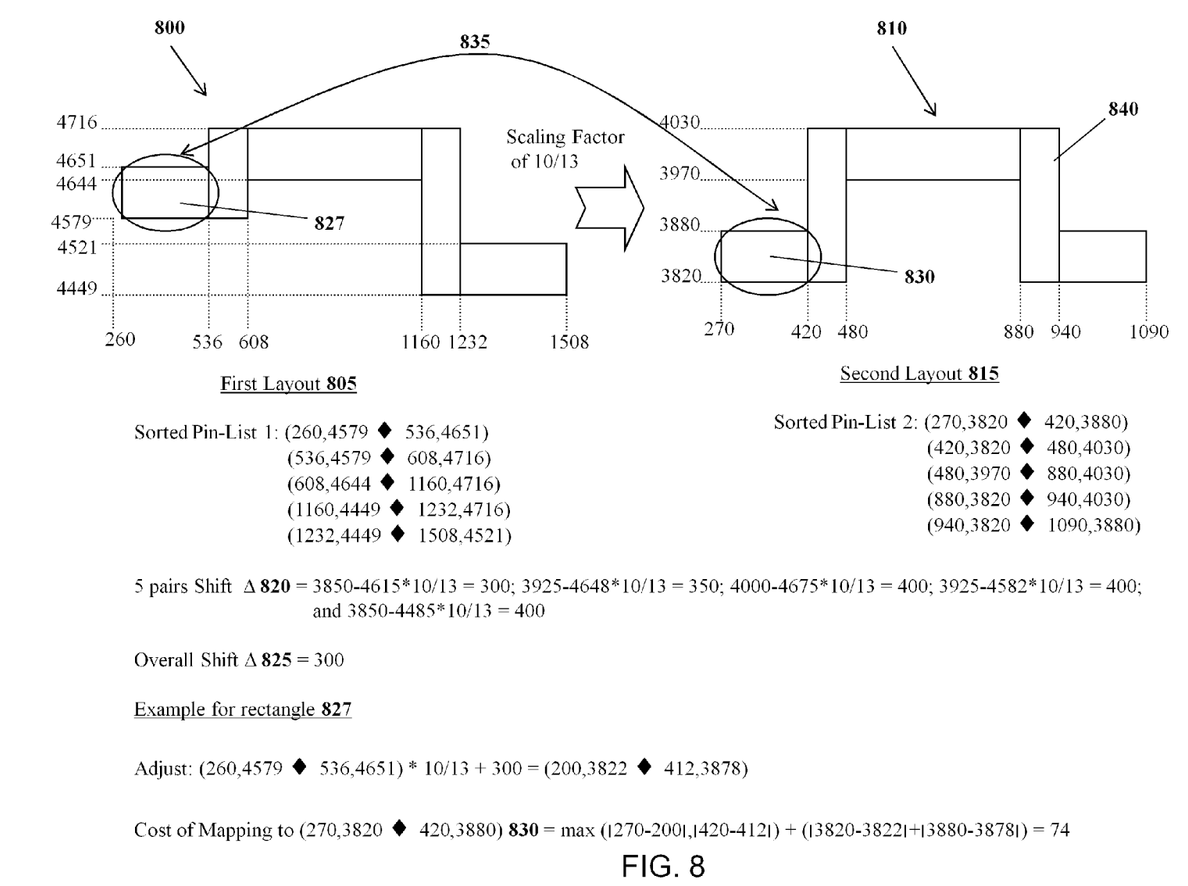

By way of additional example, as shown in FIG. 8, a set of rectangles 800 from the pin-list generated for the first layout 805 are paired with a set of rectangles 810 from the pin-list generated for the second layout 815. The shift Δ 820 in the "y" direction for each pair of rectangles is calculated using equation (1). The calculated shifts Δ in the "y" direction for each pair of rectangles are then compared, and the calculated shift Δ with the minimum absolute value is selected as the overall shift Δ 825 in the "y" direction. The mapping location or coordinates of each rectangle in the set of rectangles 800 is then adjusted based on the scaling factor and the overall shift Δ 825 using equation (2). For example, the mapping location or coordinates of rectangle 827 are adjusted based on the scaling factor and the overall shift Δ 825 using equation (2).

The mapping cost from each rectangle in the set of rectangles 800 to each rectangle in the set of rectangles 810 is then calculated using equations (3) and (4). For example, the mapping cost of moving the rectangle 827 from the adjusted position of (200,3822♦412,3878) to the position of (270, 3820♦420,3880) for the rectangle 830 is calculated as 74.

The rectangle 827 is then mapped 835 to the rectangle 830 from the set of rectangles 810 based on the mapping cost calculated for each pair of rectangles while taking into consideration the calculated overall shift Δ in the "y" direction. For example, the lowest calculated mapping cost may be used to identify the corresponding rectangle 830 in the set of rectangles 810 that corresponds with the rectangle 827. The mapping 835 for rectangles 827 and 830 is then added to the mapping table.

Figure 9:
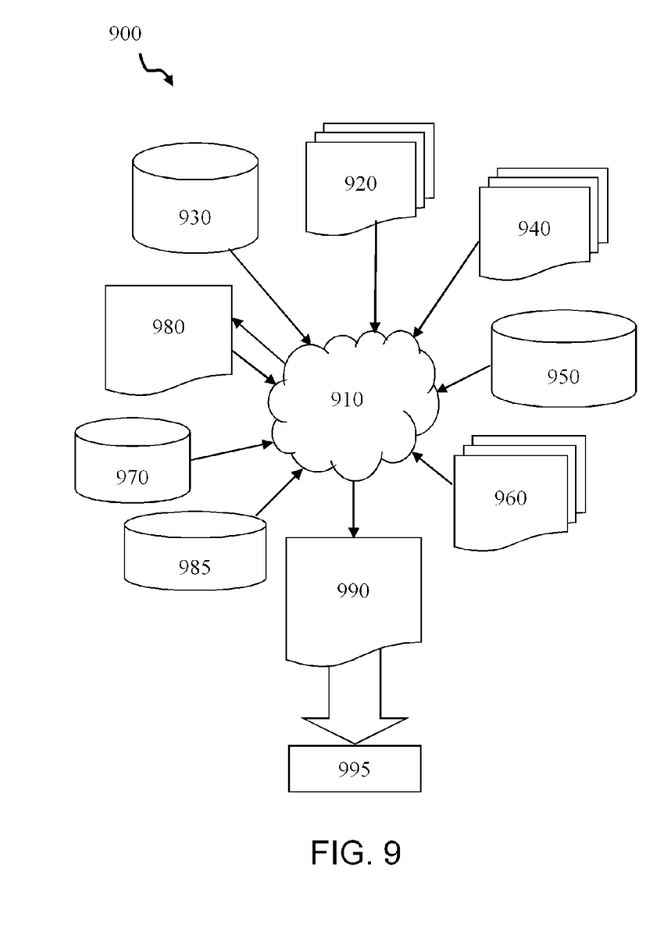
FIG. 9 is a flow diagram of a design process used in semiconductor design, manufacture, and/or test.

FIG. 9 is a flow diagram of a design process used in semiconductor design, manufacture, and/or test used with the system and method of the present invention. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system, which can be implemented with the method and system of the present invention. As such, design structure 920 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 that may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more devices. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A method comprising:
 collecting information about at least one first technology pin from at least one library cell in a first technology;
 swapping the at least one library cell in the first technology with at least one library cell in a second technology;

collecting information about at least one second technology pin from the at least one library cell in the second technology;

building a pin-mapping table that is configured to map the at least one first technology pin to the at least one second technology pin;

scaling a layout from the first technology to the second technology; and modifying the layout based on the pin-mapping table to match the at least one first technology pin to the at least one second technology pin while satisfying ground rules of the second technology, wherein at least the step of modifying the layout is performed using a processor.

2. The method of claim 1, wherein:

information about the at least one first technology pin includes a name of the at least one first technology pin and a first rectangle in a given pin layer that represents the at least one first technology pin; and the information about the at least one second technology pin includes a name of the at least one second technology pin and a second rectangle in a given pin layer that represents the at least one second technology pin.

3. The method of claim 2, wherein:

the pin-mapping table is built based on a mapping cost between the first rectangle and the second rectangle; and the mapping cost is based at least on an overall shift in a "y" direction of the first rectangle.

4. The method of claim 2, further comprising sorting the first rectangle with other first technology rectangles representative of other first technology pins in a first pin-list based on center points of the first rectangle and the other first technology rectangles.

5. The method of claim 4, further comprising sorting the second rectangle with other second technology rectangles representative of other second technology pins in a second pin-list based on center points of the second rectangle and the other second technology rectangles.

6. The method of claim 1, wherein the modifying comprises using a predetermined scaling factor to scale the layout from the first technology to the second technology and swapping in library cells of the second technology.

7. The method of claim 1, further comprising deleting all shapes except pins and a representative boundary box of the at least one first technology pin prior to scaling the first technology to the second technology, wherein the scaling comprises scaling the pins and the representative boundary box with respect to the second technology using a predetermined scaling factor.

8. The method of claim 1, further comprising:

generating hierarchical constraints based on the layout of the first technology and a corresponding ground rules file of the second technology;

generating and solving a linear program (LP) problem;

modifying the layout of the first technology based on the solved LP program; and swapping the at least one library cell in the first technology with at least one library cell in the second technology.

9. A method implemented in a computer infrastructure comprising:

collecting information about first technology pins from a first technology;

collecting information about second technology pins from a second technology;

building a pin-mapping table that is configured to map at least one first technology pin to at least one second technology pin, wherein the pin-mapping table is built based on a mapping cost between a first rectangle representative of the at least one first technology pin and a second rectangle representative of the at least one second technology pin;

scaling a layout from the first technology to the second technology; and modifying the layout based on the pin-mapping table to match the at least one first technology pin to the at least one second technology pin while satisfying ground rules of the second technology, wherein at least the step of modifying the layout is performed using a processor of the computer infrastructure.

10. The method of claim 9, wherein the mapping cost is based at least on an overall shift in a "y" direction of the first rectangle.

11. The method of claim 10, wherein the mapping cost is an amount of minimum movement that it would take to place the first rectangle over the second rectangle.

12. The method of claim 11, further comprising performing an initial scaling of the first technology to the second technology prior to collecting information about the second technology pins from the second technology.

13. The method of claim 12, wherein the overall shift in the "y" direction represents library cell growth for the first technology during the initial scaling.

14. A computer system comprising:

a CPU, a computer readable memory and a computer readable storage media;

first program instructions to pair each rectangle representative of a pin from a first technology to at least one rectangle representative of at least one pin from a second technology;

second program instructions to calculate a shift in a "y" direction for each of the pairs of rectangles;

third program instructions to compare the calculated shifts in the "y" direction for each pair of rectangles;

fourth program instructions to select a calculated shift with a minimum absolute value as an overall shift in the "y" direction from the compared pairs of rectangles;

fifth program instructions to adjusting coordinates of each rectangle from the first technology based on the selected overall shift in the "y" direction;

sixth program instructions to calculate a mapping cost for each rectangle from the first technology to each rectangle of the second technology using the adjusted coordinates of each rectangle from the first technology; and seventh program instructions to map each rectangle from the first technology to a rectangle from the second technology such that the mapped rectangles comprise a lowest calculated mapping cost, wherein the first through seventh program instructions are stored on the computer readable storage media for execution by the CPU via the computer readable memory.

15. The system of claim 14, further comprising:

eighth program instructions to add the mappings of each rectangle from the first technology to a mapping table; and ninth program instructions to modify each pin represented by each rectangle from the first technology based on the pin-mapping table to match the mapped pin represented by each rectangle from the second technology.

16. The system of claim 14, wherein the mapping cost is an amount of minimum movement that it would take to place each rectangle from the first technology over each rectangle of the second technology.

17. The system of claim 16, wherein mapping cost comprises a mapping cost in a "x" direction and a mapping cost in the "y" direction.

18. The system of claim 17, wherein the mapping cost in the "x" direction is calculated using an equation including:

If $(xl2-xl1)$ and $(xh2-xh1)$ have the same sign (+/−), then $$\text{Cost} = \max(|xl2-xl1|, |xh2-xh1|), \text{ else}$$

$$\text{Cost} = |xl2-xl1| + |xh2-xh1|$$

wherein xl1 is an "x" coordinate or position of a left bottom corner of a rectangle, yl1 is a "y" coordinate or position of a left bottom corner of the rectangle, xh1 is an "x" coordinate or position of a top right corner of the rectangle, and yh1 is a "y" coordinate or position of a top right corner of the rectangle, and |a−b| denotes the absolute value of (a−b).

19. The system of claim 18, wherein the mapping cost in the "y" direction is calculated using an equation including:

If $(yl2-yl1)$ and $(yh2-yh1)$ have the same sign (+/−), then $$\text{Cost} = \max(|yl2-yl1|, |yh2-yh1|), \text{ else}$$

$$\text{Cost} = |yl2-yl1| + |yh2-yh1|$$

wherein xl2 is an "x" coordinate or position of a left bottom corner of a new rectangle, yl2 is a "y" coordinate or position of a left bottom corner of the new rectangle, xh2 is an "x" coordinate or position of a top right corner of the new rectangle, and yh2 is a "y" coordinate or position of a top right corner of the new rectangle, and |a−b| denotes the absolute value of (a−b).

20. The system of claim 14, wherein the shift in the "y" direction is calculated using an equation including:

the shift in the "y" direction=(a center Y location of a $n_1$ rectangle for the second technology)−(a center Y location of a $n_1$ rectangle for first technology)*a scaling factor between the first technology and the second technology.

* * * * *